United States Patent [19]
Casal et al.

[11] Patent Number: 5,581,699
[45] Date of Patent: Dec. 3, 1996

[54] SYSTEM AND METHOD FOR TESTING A CLOCK SIGNAL

[75] Inventors: Humberto F. Casal; Hehching H. Li, both of Austin; David M. Wu, Spring, all of Tex.

[73] Assignee: International Business Machines Corporation, Armonk, N.Y.

[21] Appl. No.: 441,571

[22] Filed: May 15, 1995

[51] Int. Cl.$^6$ .......................... G01R 31/28; G06F 11/00
[52] U.S. Cl. ........................... 395/185.08; 371/61
[58] Field of Search ............... 395/185.08; 371/61

[56] References Cited

U.S. PATENT DOCUMENTS

| | | | |
|---|---|---|---|
| 4,510,462 | 4/1985 | Edwards | 331/1 A |
| 4,660,197 | 4/1987 | Wrinn | 371/1 |
| 4,667,328 | 5/1987 | Imran | 371/61 |
| 4,816,776 | 3/1989 | Kessler | 371/61 X |
| 4,843,617 | 6/1989 | Marshall | 375/118 |
| 5,008,636 | 4/1991 | Markinson et al. | 331/2 |
| 5,077,686 | 12/1991 | Rubinstein | 395/550 |
| 5,268,656 | 12/1993 | Muscavage | 331/45 |
| 5,294,894 | 3/1994 | Gebara | 331/1 A |
| 5,359,232 | 10/1994 | Eitrheim | 307/268 |
| 5,361,290 | 11/1994 | Akiyama | 377/47 |
| 5,406,590 | 4/1995 | Miller | 375/376 |
| 5,422,835 | 6/1995 | Houle | 364/703 |
| 5,448,193 | 9/1995 | Baumert | 327/156 |

*Primary Examiner*—Robert W. Beausoliel, Jr.
*Assistant Examiner*—Glenn Snyder
*Attorney, Agent, or Firm*—Kelly K. Kordzik; Winstead Sechrest & Minick P.C.; Mark E. McBurney

[57] ABSTRACT

The present invention utilizes a test circuit for receiving a reference clock signal and a sense clock signal and subsequently determining whether or not the reference and sense clock signals are either correct multiples of each other and/or in phase with each other. The test circuit may be located on the same chip with the microprocessor and the clock circuitry. The clock circuitry may include a phase locked loop ("PLL") circuit for receiving the reference clock signal and producing a sense clock signal for use by the remainder of the chip, wherein the sense clock signal is a multiple of the reference clock signal. The test circuit may count the number of cycles of the sense clock signal occurring within a predetermined amount of time, which may be proportional to the reference clock period. Alternatively, the sense clock signal and the reference clock signal may be passed through an XOR circuit and then the number of cycles counted within a predetermined time period. In both cases, if the number of cycles counted is not what was expected, then it is known that the sense clock signal was not properly produced by the PLL circuit.

4 Claims, 6 Drawing Sheets

SYSTEM AND METHOD FOR TESTING A CLOCK SIGNAL

FIELD OF THE INVENTION

The present invention relates in general to data processing systems, and in particular, to a system and method for detecting phase misalignment of on-chip generated clock signals.

BACKGROUND OF THE INVENTION

The system clock is the electronic circuit in a computer that generates a steady stream of tiny pulses—the digital signals that synchronize every operation. The system clock signal typically operates at a specific frequency between 50 million and 150 million cycles per second (megahertz, or MHz) and is precisely set by a quartz signal inside the clock circuit. The clock rate of a computer is one of the prime determinants of its overall processing speed, and it can go as high as the other components of the computer allow.

In order to achieve high performance, modern microprocessors often generate or synthesize on-chip clocking by multiplying the frequency of an off-chip source. Thus, a 50 MHz off-chip source can be used to generate on-chip clocking of 200 MHz for instance. The clock generation and distribution logic in a high performance microprocessor is sensitive and complex involving complex analog circuits, delay lines and feedback circuits, which are very sensitive to manufacturing process variations.

During manufacturing, and the debug and system testing, it is not practical to directly observe the on-chip clocking. Techniques to check the on-chip clocking during manufacturing are complex and time consuming and do not easily fit into the process of checking the digital circuitry. In order to reduce the test time for chips and to improve the quality of the testing of the clocking circuitry, a low cost but effective test is needed.

SUMMARY OF THE INVENTION

The foregoing need is solved by the present invention, which utilizes a test circuit for receiving a reference clock signal and a sense clock signal and subsequently determining whether or not the reference and sense clock signals are either correct multiples of each other and/or in phase with each other. The test circuit may be located on the same chip with the microprocessor and the clock circuitry. The clock circuitry may include a phase locked loop ("PLL") circuit for receiving the reference clock signal and producing a sense clock signal for use by the remainder of the chip, wherein the sense clock signal is a multiple of the reference clock signal.

The test circuit may count the number of cycles of the sense clock signal occurring within a predetermined amount of time, which may be proportional to the reference clock period. Alternatively, the sense clock signal and the reference clock signals may be passed through an XOR circuit and then the number of cycles counted within a predetermined time period. In both cases, if the number of cycles counted is not what was expected, then it is known that the sense clock signal was not properly produced by the PLL circuit.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
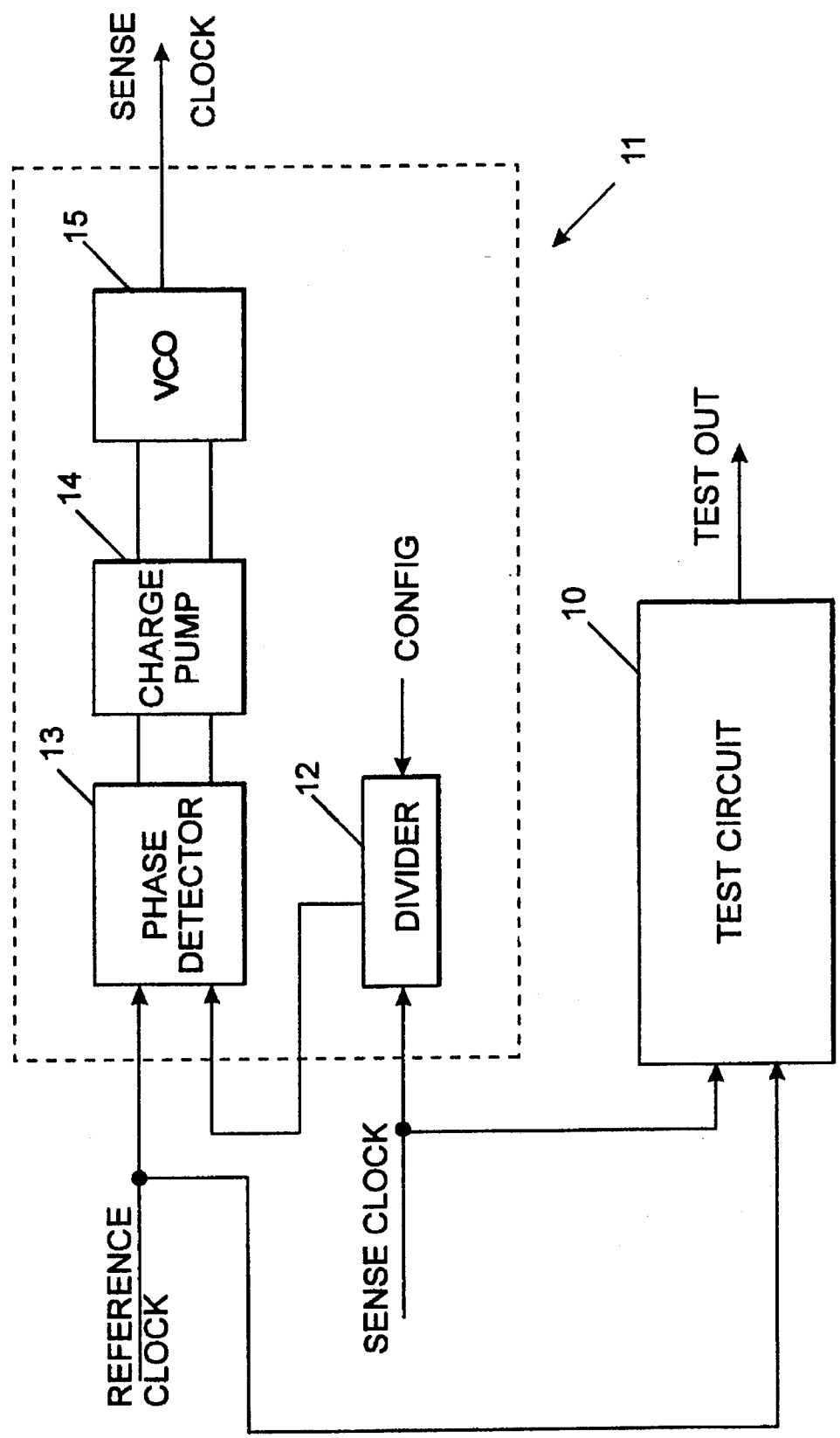
FIG. 1 illustrates a diagram of a PLL circuit and the test circuit of the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

An embodiment of the present invention solves a problem by preferably providing circuitry on the same chip as the microprocessor that creates digital signals that represent the clocking alignment and captures the signals over a period of time with a unique resulting value indicating that the on-chip clocks have the proper frequency and alignment. An embodiment of the present invention loads and manipulates the counter with standard digital controls and can be programmed to provide checking for any valid frequency. Referring to FIG. 1, there is illustrated clock synthesizer 11, which may be a PLL circuit comprising a phase detect circuit 13, a charge pull-up circuit 14 and a voltage controlled oscillator ("VCO") circuit 15 along with a divider circuit 12, which receives a CONFIG input (for example, from the microprocessor through an input from the user) to provide the clock multiplier factor for multiplying the received reference clock to a desired multiple. PLL circuit 11 is well-known in the art.

Figure 6:
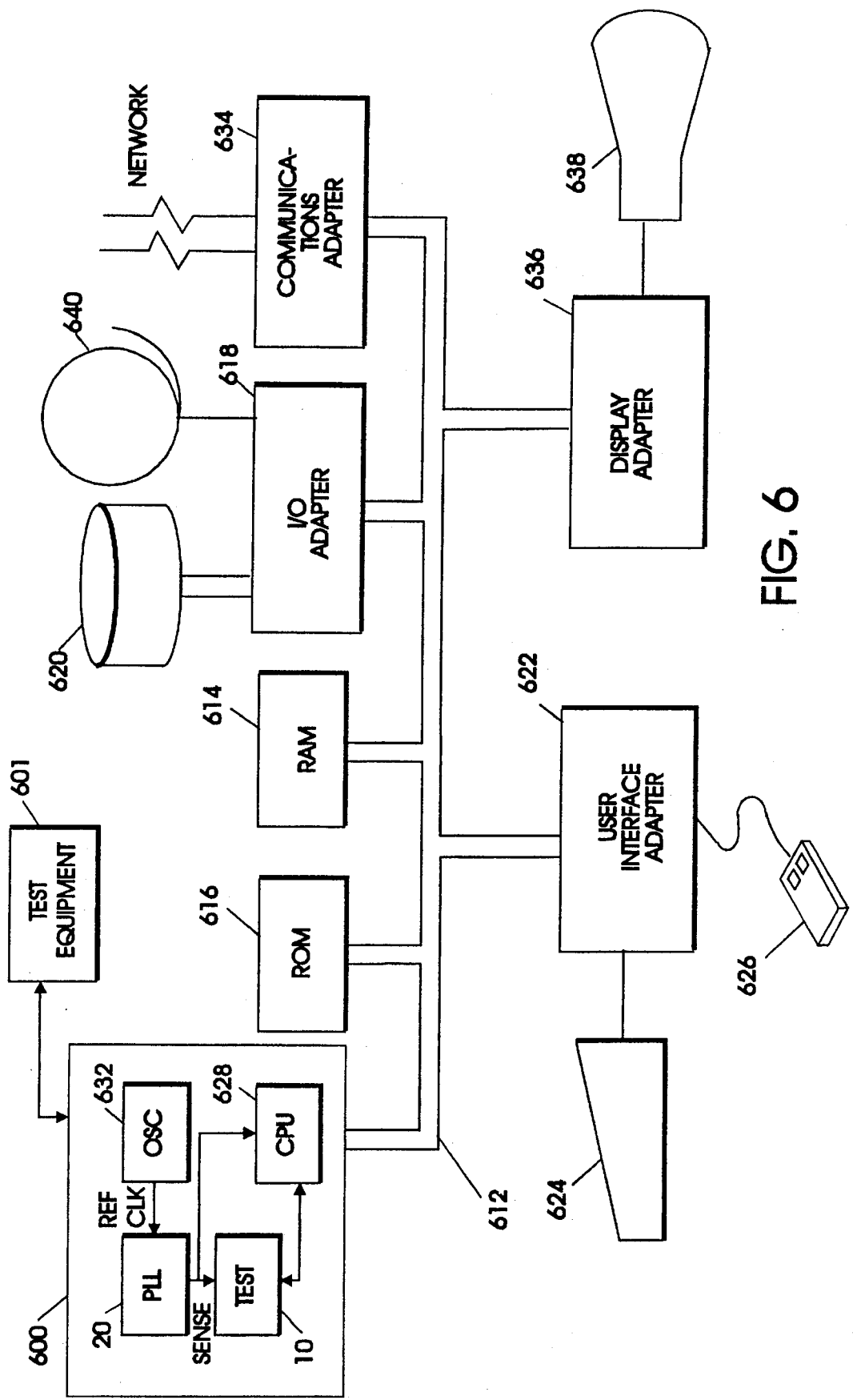
FIG. 6 illustrates a data processing system utilizing an embodiment of the present invention.

The reference clock signal (also referred to herein as "REF_CLK") may be received from oscillator 632 (see FIG. 6). The reference clock signal is inputted to PLL circuit 11, which creates the proper internal clock, which may be a multiple frequency of the reference clock signal (2×, 3×, 4×. . . ). The sense clock signal is the resulting internal clock frequency desired within the chip circuitry and is fed back within PLL circuit 11 to maintain phase relation with respect to REF_CLK. The sense clock signal (also referred to herein as "SNS_CLK") is also sent to test circuit 10. Test circuit 10 receives both the sense clock signal and the reference clock signal and provides a scannable output representing the test result. The test result is a count that may be compared with an expected result to complete the test of the clock circuitry.

Figure 2:
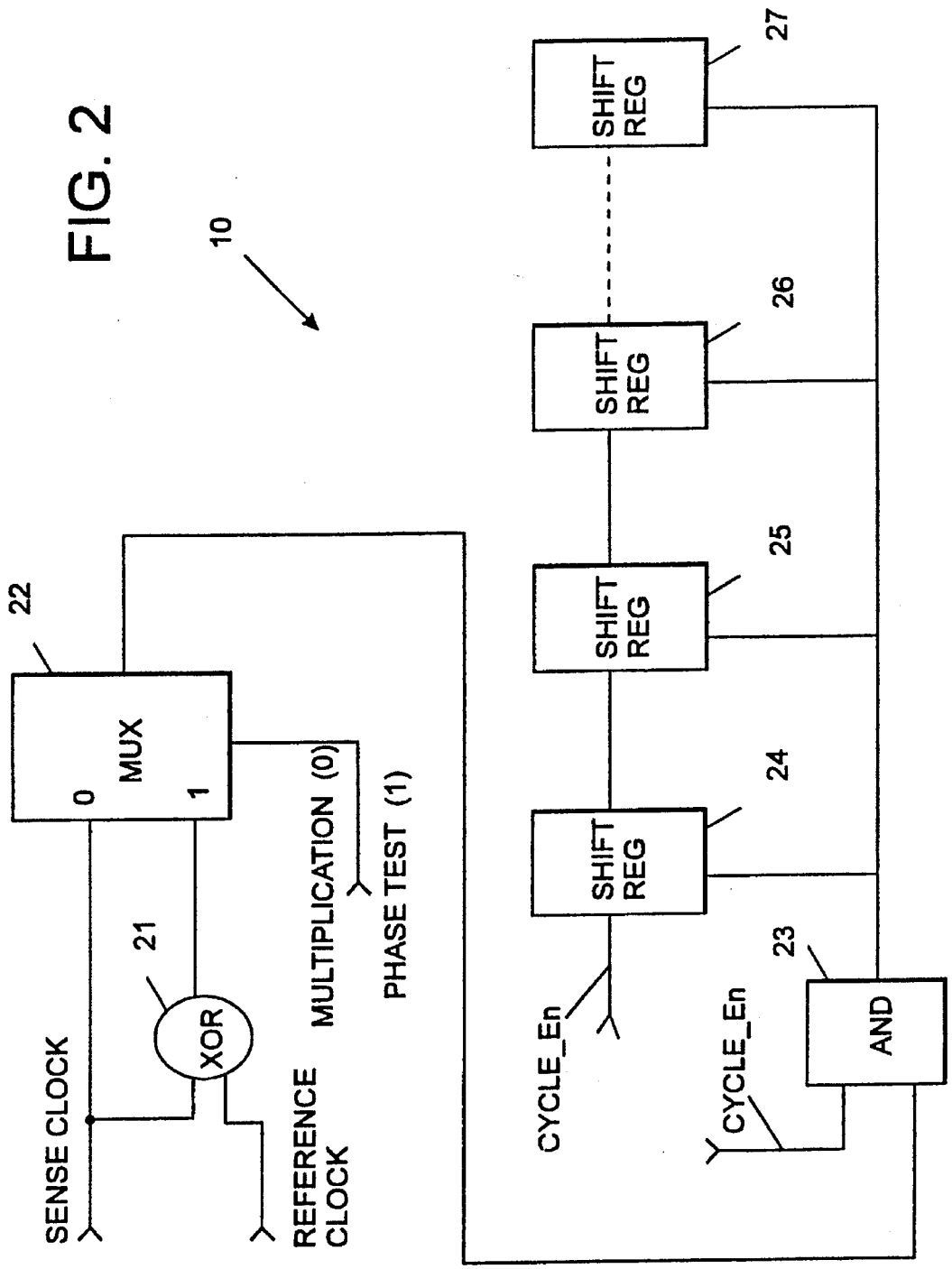
FIG. 2 illustrates the test circuitry of the present invention.

Referring next to FIG. 2, there is illustrated a more detailed diagram of test circuit 10. Multiplexor circuit ("MUX") 22 provides the capability to do two kinds of tests: a multiplication test, which counts the number of sense clock cycles occurring within the clock period of the reference clock signal to verify the sense clock (also referred to as the internal clock) frequency, and the phase test, which provides a count that verifies alignment of the internal clock with the reference clock signal. For example, multiplexor circuit 22 may receive an input from CPU 628 (see FIG. 6) to choose the "0" input of multiplexor 22. This selects the aforementioned multiplication test to verify that the sense clock is an accurate multiple of the reference clock signal.

Alternatively, multiplexor circuit 22 may receive a signal from CPU 628 to select the "1" input, which is coupled to the output of XOR logic circuit 21. XOR logic circuit 21 has one input receiving the sense clock signal and a second input receiving the reference clock signal. The function of XOR logic circuit 21 is further described below with respect to FIG. 4.

Whichever multiplexor input is selected, the signal at that input is outputted from multiplexor circuit 22 to one of the inputs to AND logic circuit 23, which has its other input receiving an enable signal (hereinafter referred to as the "CYCLE_EN" signal). As will be described below, the CYCLE_EN period may be proportional to the reference clock signal, e.g., the CYCLE_EN period may be equal to one reference clock period. A period is the length of time required for an oscillation to complete one full cycle.

AND circuit 23 ANDs the output from multiplexor 22 with the CYCLE_EN signal, and inputs this output to a series of shift registers 24–27 (the number of shift registers is dependent upon the implementation). Essentially, whether the multiplication test or the phase test is to be conducted, the output of multiplexor circuit 22 is sampled by the plurality of scannable shift registers 24–27 during a predetermined period of time, which is specified by the CYCLE_EN signal, which may be set to be equal to a reference clock period. As a result, 1-bits are shifted into registers 24–27 from left to right with the clocking provided by the output from multiplexor circuit 22. The number of bits scanned into registers 24–27 is equal to the number of multiplexor output clock signals provided under the CYCLE_EN period.

Figure 3:
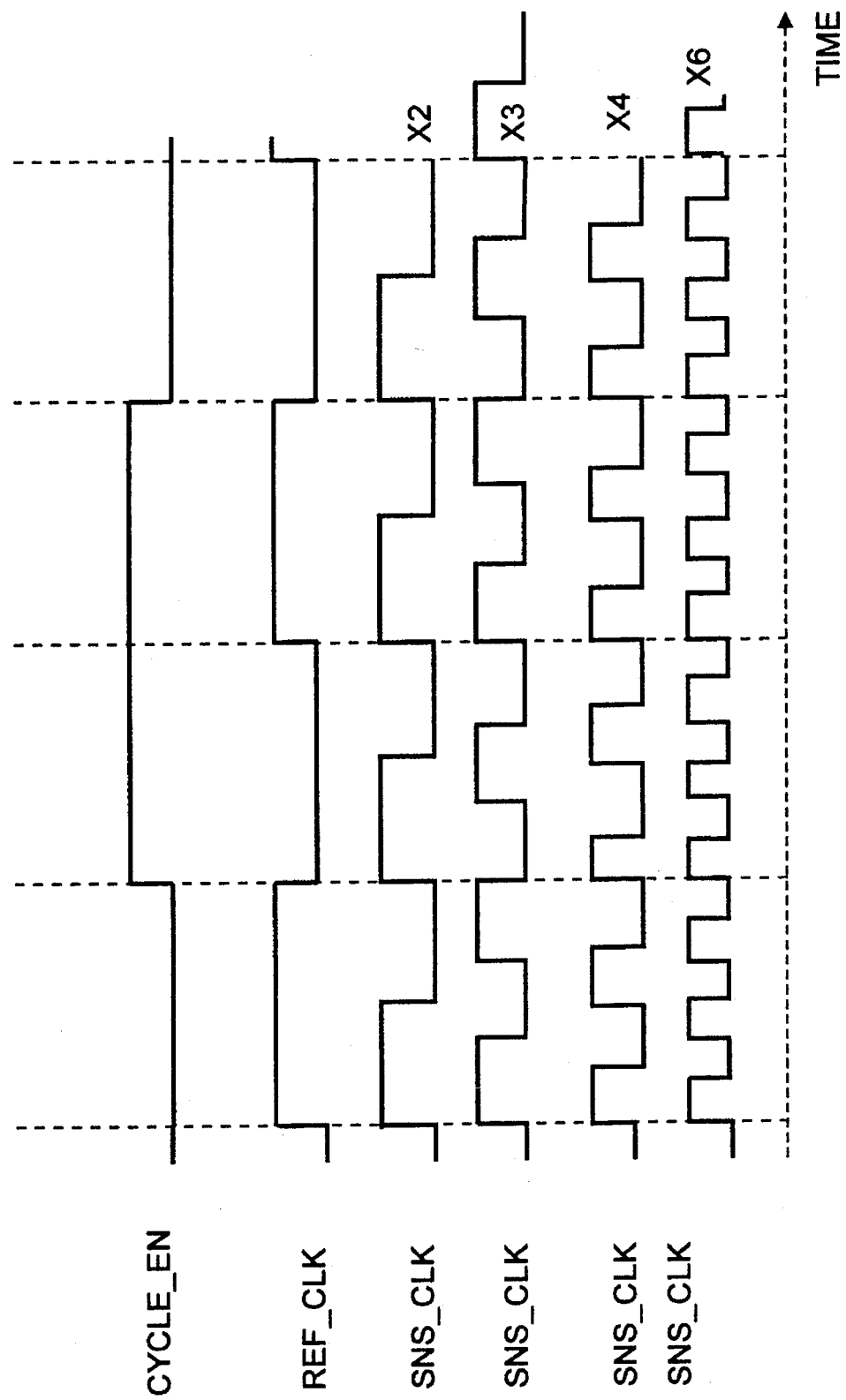
FIG. 3 illustrates a timing diagram illustrating a test to determine whether or not a sense clock signal has been properly and accurately multiplied by the PLL circuit.

Referring next to FIG. 3, there is shown a timing diagram illustrating an example of a multiplication test. A signal may be provided by other logic circuitry (not shown), which creates the CYCLE_EN signal, which may last for one period of the reference clock signal (REF_CLK). Four examples of SNS_CLK frequencies are shown. It may be easily seen that the multiplication test is a count of sense cycles during one reference clock cycle. For example, as illustrated, if PLL circuit 111 produces a 2× multiple of REF_CLK signal, then two cycles will be counted during the CYCLE_EN period. The same applies for the illustrated 3×, 4× and 6× SNS_CLK signals. Thus, if PLL circuit 11 is properly producing a 2× multiple of the reference clock signal, then 2 bits will be scannable from shift registers 24–27.

Figure 4:
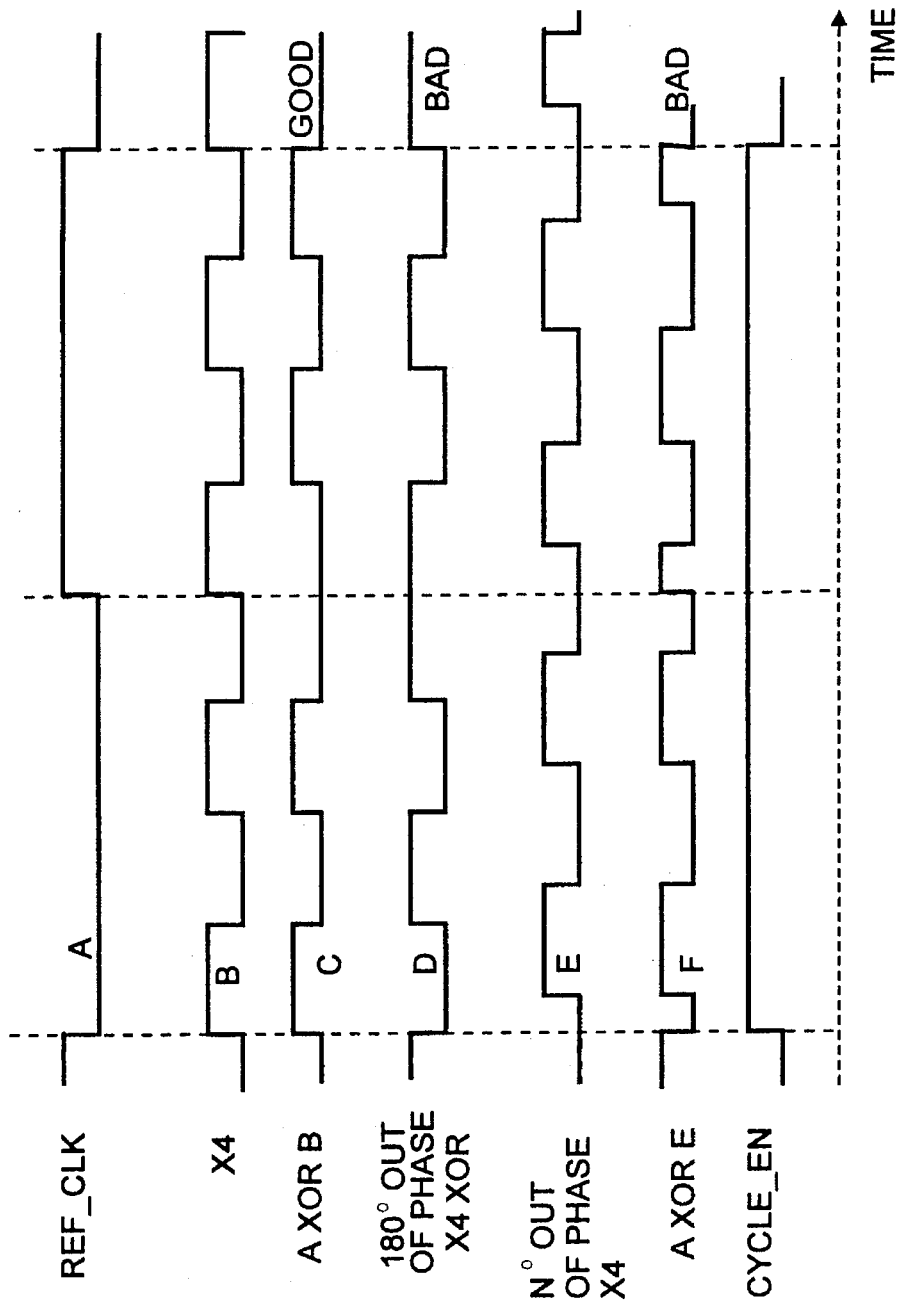
FIG. 4 illustrates a timing diagram for testing the phase relationship between a reference clock signal and a sense clock signal.

Referring next to FIG. 4, there is illustrated a timing diagram of an example phase test for a 4× internal sense clock, which is a 4× multiple of the reference clock signal. As described above, XOR circuit 21 XORs the reference clock signal with the sense clock signal, and this result (designated as C) is shifted into registers 24–27. As illustrated, shift registers 24–27 will contain four 1-bits indicating that the sense clock signal and the reference clock signal are in phase. Phase is a relatively measurement that describes the temporal relationship between edges of two signals.

Any phase shift of the sense clock relative to the reference clock will result in a count different than four. Waveform D in FIG. 4 illustrates the instance where the sense clock signal is 180° out of phase with the reference clock signal, resulting in a count of 3. Waveform F results if the phase between the sense clock signal and the reference clock signal is out of alignment by 0<N<180 degrees. Note, the design of the test logic circuitry is done so that delay differences between the sense clock, reference clock and cycle enable clock signals are minimized as the signals arrive at test circuit 10.

Figure 5:
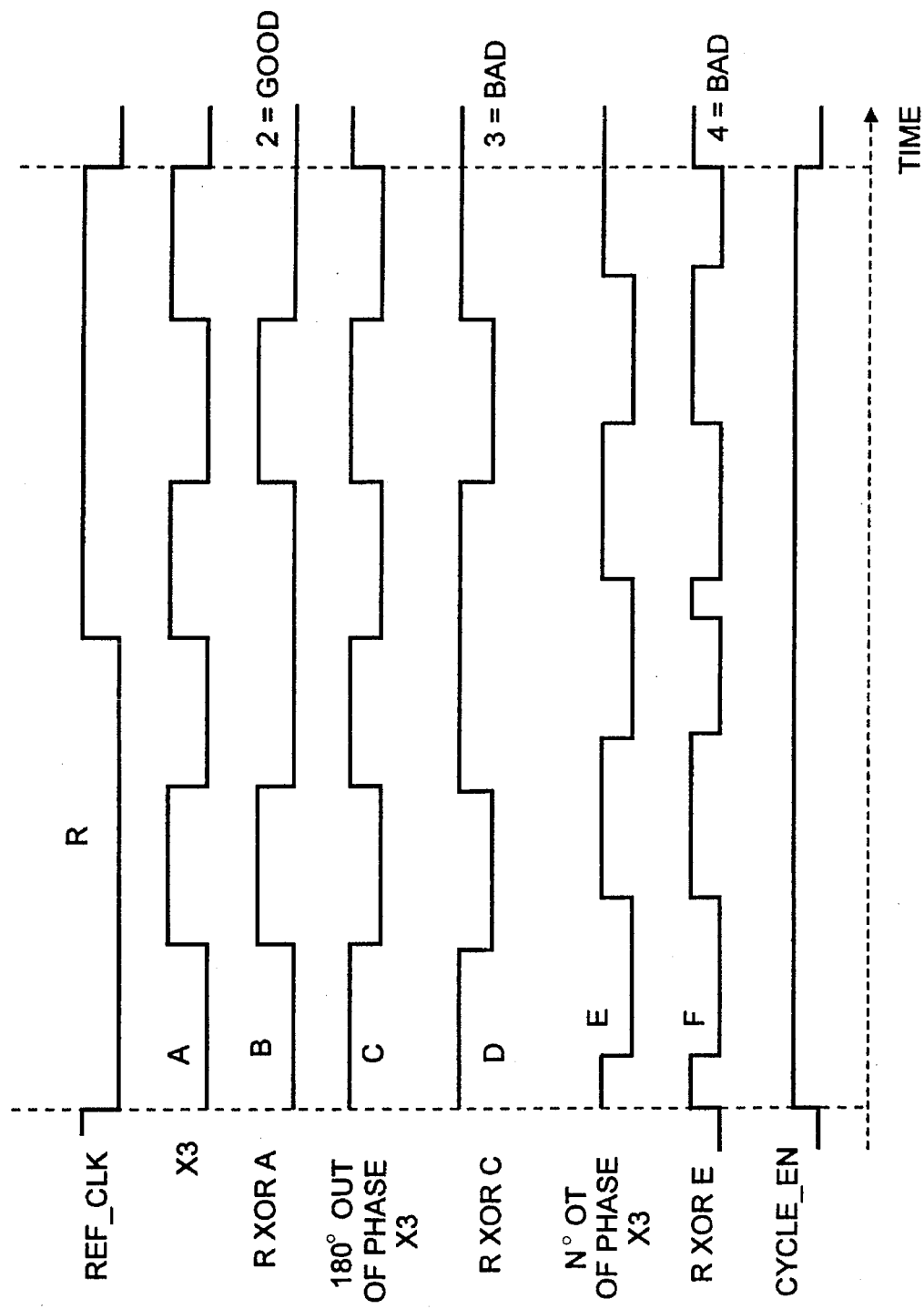
FIG. 5 illustrates a phase test for a times 3 (3×) clock signal.

Referring next to FIG. 5, there is illustrated an example of the phase alignment test for a 3× sense clock signal, similarly as illustrated for the 4× clock signal in FIG. 4.

As noted throughout, test circuit 10 may be controllable by CPU 628 as illustrated in FIG. 6. Thus, test circuit 10 is digitally controllable to test an on-chip clock synthesizer for proper clock synthesis (multiplication) and phase alignment.

Referring to FIG. 6, there is illustrated a data processing system using an embodiment of the present invention.

FIG. 6 illustrates a typical hardware configuration of a workstation in accordance with the subject invention having processor 10 (see FIG. 1 ), and a number of other units interconnected via system bus 612. The workstation shown in FIG. 6 includes random access memory (RAM) 614, read only memory (ROM) 616, and input/output (I/O) adapter 618 for connecting peripheral devices such as disk units 620 and tape drives 640 to bus 612, user interface adapter 622 for connecting keyboard 624, mouse 626, and/or other user interface devices such as a touch screen device (not shown) to bus 612, communication adapter 634 for connecting the workstation to a data processing network, and display adapter 636 for connecting bus 612 to display device 638.

As illustrated, chip 600 contains CPU 628, PLL circuit, test circuit 10 and oscillator 632. Generally, an oscillator is an electronic circuit that produces a periodically bearing output at a control frequency. Oscillator circuit 632 may produce the reference clock signal for input to both PLL circuit 20 and test circuit 10.

Control of test circuit 10 may be performed through software stored within one of storage devices 614, 616, 620 or 640 within the data processing system, received through the network by communications adapter 634, or inputted by a user through either keyboard 624 or mouse 626 and user interface adapter 622. The results of the test may be displayed on display 638.

Alternatively, a piece of test equipment 601 may be coupled to the data processing system, or directly to chip 600 for control of test circuit 10. Such a typical piece of test equipment 601 is a high performance tester manufactured by Hewlett-Packard, Teradyne, Takeda Riken, etc.

Alternatively, test circuit 10 may be replaced by program code executable by CPU 628.

Although the present invention and its advantages have been described in detail, it should be understood that various changes, substitutions and alterations can be made herein without departing from the spirit and scope of the invention as defined by the appended claims.

What is claimed is:

1. A system for testing a clock signal generator in a data processing system, said system comprising:

means for receiving a clock signal;

means for counting a number of cycles of said clock signal occurring in a predetermined period of time; and means for outputting said number of cycles of said clock signal occurring in said predetermined period of time, wherein said means for counting a number of cycles of said clock signal occurring in a predetermined period of time further comprises:

an AND logic circuit coupled to said receiving means at one input of said AND logic circuit, another input of said AND logic circuit receiving a reference signal dependent upon said predetermined period of time; and a plurality of scannable shift registers coupled to an output of said AND logic circuit, said plurality of scannable shift registers receiving said reference signal.

2. A method of testing an accuracy of a generated clock signal in a data processing system, said method comprising the steps of:

receiving a clock signal from said data processing system;

counting a number of cycles of said clock signal occurring in a predetermined period of time; and outputting said number of cycles of said clock signal occurring in said predetermined period of time, wherein said step of counting said number of cycles of said clock signal occurring in said predetermined period of time further comprises the steps of performing an AND logical operation of said clock signal and an enable signal, and inputting a resulting signal from said AND logical operation into a plurality of scannable shift registers.

3. The method as recited in claim 2, wherein said enable signal is proportional to said predetermined period of time.

4. A computer system comprising:

a memory device, an input/output device, and a display device coupled via a bus to a processor, wherein said processor is embodied on a single chip that includes:

a clock signal generator generating a first clock signal;

a phase locked loop circuit receiving said first clock signal and outputting a second clock signal corresponding to said first clock signal; and a test circuit comprising:

an XOR circuit receiving said first and second clock signals;

a MUX circuit having a first input coupled to an output of said XOR circuit, said MUX circuit having a second input receiving said second clock signal, said MUX circuit including a means for selecting between said first and second inputs for output;

an AND circuit having a first input coupled to said MUX circuit, and a second input receiving an enable signal corresponding to said first clock signal; and a plurality of shift registers coupled to an output of said AND circuit and receiving said enable signal.

* * * * *